Jan. 12, 1965 R. H. BECHMANN 3,165,651

PIEZOELECTRIC CRYSTAL APPARATUS

Filed Dec. 1, 1959

INVENTOR,
RUDOLF H. BECHMANN

BY Harry M. Saragovitz

ATTORNEY.

United States Patent Office 3,165,651

Patented Jan. 12, 1965

3,165,651

PIEZOELECTRIC CRYSTAL APPARATUS

Rudolf H. Bechmann, Oceanport, N.J., assignor to the United States of America as represented by the Secretary of the Army Filed Dec. 1, 1959, Ser. No. 856,623
4 Claims. (Cl. 310—9.7)
(Granted under Title 35, U.S. Code (1952), sec. 266)

The invention described herein may be manufactured and used by or for the Government for governmental purposes, without the payment of any royalty thereon.

This invention relates to piezoelectric crystal plates used as oscillators, and particularly to special coating arrangements thereon to effect the excitation of the plates by an electric field parallel to the major surfaces thereof.

In high frequency operation above 500 kc./s. quartz elements or plates of AT or BT cuts vibrating in the thickness-shear mode of operation, are generally used. The usual excitation of these cuts is achieved by a field perpendicular to the thickness of the plate using two electrodes arranged on the opposite major surfaces of the plate, normal to the thickness direction. However, in the application of these crystal plates for oscillators in high precision frequency apparatus, such as quartz clocks, and in all cases where a high impedance of the crystal is necessary, the stability is very limited by the low impedance resulting from the influence of the electrodes on the opposite major surfaces of the plate, which produce a field perpendicular thereto.

One of the objects of this invention is to provide piezoelectric crystal apparatus which substantially avoids one or more limitations of the prior apparatus including piezoelectric crystal elements.

Another object of this invention is to increase the frequency stability of piezoelectric crystal elements.

Another object of this invention is to attain an impedance level at least 50 times higher than has been obtained heretofore with piezoelectric elements.

In the consideration of the theory of the thickness vibration of piezoelectric plates, it has been found that the thickness-shear mode can be excited by an electric field parallel to the major faces of the crystal plate. The piezoelectric stress constant for the usual perpendicular field excitation of the thickness-shear as a function of the orientation angle $\theta$ of the plate is well known and is given by the relation $$e_\theta = e_{11} \cos^2 \theta + e_{14} \cos \theta \sin \theta$$

where $e_\theta$ is the effective piezoelectric constant, and $e_{11}$ and $e_{14}$ are piezoelectric constants of quartz related to the main axis of the crystal.

The same thickness-shear mode can be excited by applying a field parallel to the crystal plate, and the corresponding piezoelectric stress constant is then expressed by $$e_{\theta\psi} = (e_{11} \cos \theta \sin \theta + e_{14} \sin^2 \theta) \sin \psi$$

where the azimuth angle $\psi$ is taken from the X-axis in the plane of the plate. For any angle $\psi$ except $\psi=0$, the thickness-shear mode XY', e.g., the AT- or BT-cuts, can be excited. However, for maximum excitation, the angle $\psi$ should be equal to 90° so that the field would be parallel to the Z'-axis or perpendicular to the X-axis. In other words, the direction of the electric field may have any arbitrary direction in the plane of the plate except parallel to the X-axis, but for maximum excitation, angle $\psi$ should be 90° or perpendicular to the Z'-axis.

In accordance with this invention a thickness-shear mode piezoelectric crystal element adapted to vibrate in an oscillating circuit includes means for providing an electric field parallel to the major surface of the element comprising a pair of discrete electrodes mounted on at least one of said major surfaces, the proximal ends of the electrodes being spaced from each other to form a gap therebetween, said gap being oriented substantially perpendicular to the Z'-axis of said element.

For a more detailed description of the invention, together with other and further objects thereof, reference is had to the following description taken in connection with the accompanying drawing, in which similar numerals designate similar elements and wherein.

Figure 1:
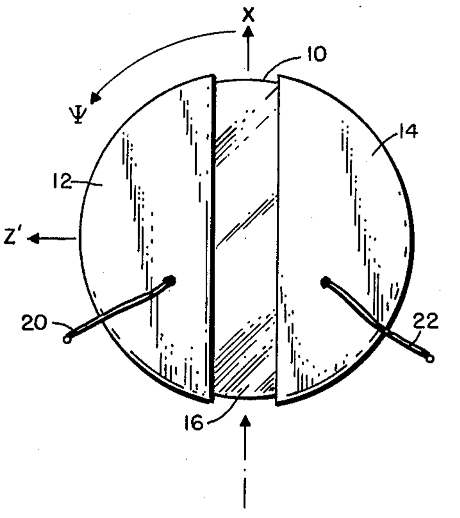
FIGS. 1 and 2 are respectively major surface and edge views of a high frequency thickness-shear mode piezoelectric quartz crystal plate provided with metallic electrodes in accordance with this invention.
Figure 2:
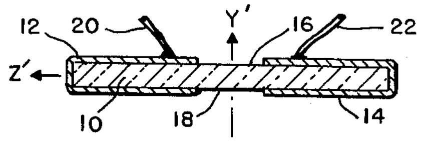

Referring to the drawings, FIGS. 1 and 2 are respectively major surface and edge views of a piezoelectric crystal plate or element 10 having electrodes 12 and 14 extending over opposite major surfaces of the plate and connected over the edge surfaces except for an uncovered gap 16, 18 extending around said edge surfaces and across the center of the major surfaces of the plate. The proximal ends of electrodes 12 and 14 are of linear contour and identical in form, and may comprise a pair of film-like metallic coatings which may be applied in a conventional manner, such as by thermal evaporation or chemical deposition. The electrodes 12 and 14 are respectively connected to leads 20 and 22 by which plate 10 can be connected into an electronic circuit to apply an electric field parallel to the major surfaces of the crystal element. The width of the gap or separation 16, 18 between the electrodes 12 and 14 may vary, the center line of such gaps in the electrodes on opposite sides of plate 10 being aligned with respect to each other.

This specification follows the conventional terminology as applied to crystalline quartz which employs three orthogonal or mutually perpendicular X, Y and Z axes, respectively of piezoelectric quartz material, and which employs two rotated axes, Y' and Z' to designate the directions of axes of a piezoelectric body angularly oriented with such X, Y and Z axes thereof. The crystal element 10 may be, for example, a thickness-shear mode AT-cut or other suitable cut, vibrating in the thickness-shear mode of motion. It will be understood that the crystal element 10 may have square, rectangular, circular or other shaped major surfaces and may be operated in the fundamental or any harmonic of the thickness-shear mode of vibration.

As illustrated in the drawing, the gap 16, 18 between electrodes 12 and 14, on both major surfaces of element 10, is so oriented that its prescribed center line lies substantially perpendicular to the Z' axis, with the azimuth angle $\psi$ equal to 90°.

An AT-cut quartz plate operating at 1000 kc./s. was originally provided with electrodes on both major surfaces for excitation by a field perpendicular to the crystal plate. The crystal plate was then stripped of the original electrodes and then provided with electrodes in accordance with this invention for excitation by a field parallel to the plate. Data on this crystal is given below to demonstrate the advantages of the present invention:

| | Perpendicular Field Excitation | Parallel Field Excitation |
|---|---|---|
| F ... kc./s | 1000.000 | 1000.381 |
| $L_1$ ... h | 1.43 | 75.5 |
| $C_1$ ... μμf | $177 \cdot 10^{-4}$ | $3.35 \cdot 10^{-4}$ |
| $C_0$ ... μμf | 12 | 3.3 |
| $R_1$ ... ohms | 5 | 180 |
| Q | $1.8 \cdot 10^6$ | $2.64 \cdot 10^6$ |
| Gap ... inches | ---------- | 0.040 |

In the above example, all measurements were made at room temperature and in a vacuum. The frequency using parallel field excitation is slightly higher than the frequency using perpendicular field excitation. Q and $C_0$ have their usual significance, Q being the ratio of reactance to resistance of the equivalent circuit of the crystal, and $C_0$ being the static capacitance, $L_1$ is the motional inductance of the crystal, and $C_1$ and $R_1$ being respectively its motional capacitance and resistance. The motional inductance $L_1$ is approximately 50 times larger in an oscillator excited by a parallel field than in an oscillator excited by a perpendicular field. The value of Q is about one and a half times larger in an oscillator excited by a parallel field than for the perpendicular field excitation. Due to the very high inductance $L_1$ and the high values for Q, quartz oscillators excited by a parallel field are particularly suitable for application to high precision frequency control. The motional inductance $L_1$ in the case of the parallel field excitation is dependent upon the width of the gap between the electrodes. With an increase of the width of the gap, the resistance is increased; thus in a practical application, the limitation on the width of the gap is a function of the resistance of the crystal.

Figure 3:
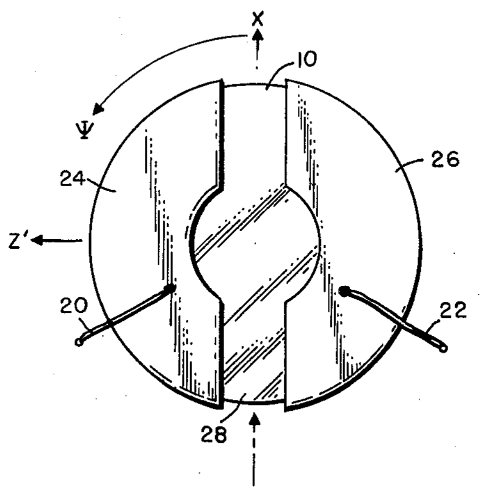
FIG. 3 is a major surface view of the quartz crystal element of FIGS. 1 and 2 provided with another form of metallic electrodes.

In the embodiment of FIG. 3, much less aging of the frequency of the crystal plate is achieved when the electrodes 24 and 26 assume a pattern similar to that shown. Electrodes 24 and 26 extend on to the back surface (not shown) of element 10 and are in the form of a mirror image of that portion applied to the front surface. In this arrangement, the proximal edges of electrodes 24 and 26 lying on a common major surface of crystal 10 are provided with opposing and identical medial arcuate cutouts, thus forming a larger gap 28 in the central motional portion of crystal plate 10 between the electrodes 24 and 26. The center of the crystal plate where the maximum mechanical stress occurs is not covered, thereby reducing the aging due to the contacting of the vibratile portion of the plate by the electrodes. The center line of the gap 28 between electrodes 24 and 26 extends around crystal 10 and is oriented substanitally perpendicular to the Z′-axis.

It will be understood that the electrodes may be positioned so that a radio frequency applied thereto will provide an electric field parallel to the major surfaces of the crystal element. Such parallel field excitation in an oscillator may be provided by using a pair of spaced eletcrodes on a common major surface, or an electrode on each major surface displaced with respect to each other. However, in these arrangements of the electrodes, the motional resistance of the crystal plate is rather high due to the greater separation between the electrodes.

Figure 4:
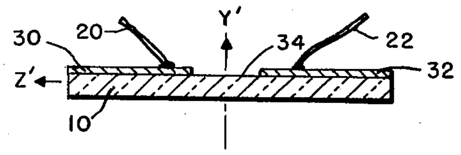
FIG. 4 is an edge view of the quartz crystal element of FIGS. 1 and 2 provided with another form of metallic electrodes.

FIG. 4 is an edge view of the crystal plate 10 of FIGS. 1 and 2 provided with parallel field producing electrodes 30 and 32, consisting of metallic or other conductive coatings on one major surface thereof. The advantages of the field parallel to the plate may be obtained by using only one small electrode, the other electrode 30 or 32 being of larger size, if desired. Furthermore, electrodes 30 and 32 need not be equally spaced from the center of the major surface, one edge of an electrode being closer to the center of the plate than the other electrode 30 or 32. The center line of the gap 34 between electrodes 30 and 32 is oriented substantially perpendicular to the Z′-axis.

Figure 5:
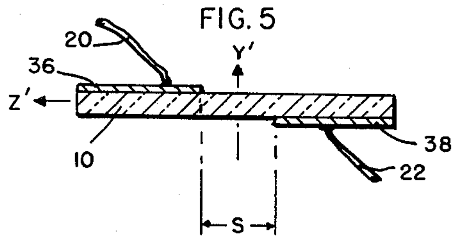
FIG. 5 is an edge view of the quartz crystal element of FIGS. 1 and 2 provided with still another form of metallic electrodes.

FIG. 5 is an edge view of quartz crystal plate 10 provided with parallel field producing electrodes 36 and 38 wherein one electrode extends inwardly from the edge on one major surface and the other electrode extends inwardly from an opposite peripheral edge on the other major surface. Crystal 10 is characterized by a gap or space S between the proximal ends of electrodes 38 and 36. The center line of the space S is oriented substantially perpendicular to the Z′-axis for maximum parallel field excitation.

While there has been described what is at present considered to be the preferred embodiments of the invention, it will be obvious to those skilled in the art that various changes and modifications may be made therein without departing from the invention, and it is therefore aimed in the appended claims to cover all such changes and modifications as fall within the spirit and scope of the invention.

What is claimed is:

1. A thickness-shear mode piezoelectric crystal element adapted to vibrate in an oscillating circuit, means for providing an electric field parallel to the major surfaces of said crystal element comprising a pair of discrete electrodes each partially covering both of said major surfaces and continuous over the edges of said crystal element, the areas on said major surfaces covered by said electrodes being co-extensive, the ends of said electrodes being spaced from each other to form respective mutually opposing uncovered portions on said major surfaces, said uncovered portions being substantially perpendicular to the Z′-axis of said crystal element.

2. The invention as set forth in claim 1 and wherein the ends of said electrodes on said major surfaces are equally spaced from a coextensive prescribed center line on said major surfaces.

3. The invention as set forth in claim 2 and wherein the ends of said electrodes on said major surfaces are provided with opposing and substantially identical medial arcuate cutouts.

4. A thickness-shear mode piezoelectric crystal element adapted to vibrate in an oscillating circuit, means for providing an electric field parallel to the major surfaces of said crystal element comprising a pair of discrete electrodes, one of said electrodes being mounted on one of said major surfaces and the other of said electrodes being mounted on the other of said major surfaces, the proximal ends of said electrodes being of linear contour and being displaced with respect to each other on opposite sides of the X-axis of said crystal element, said linear ends of said electrodes being substantially parallel to said X-axis and being substantially perpendicular to the Z′-axis of said crystal element.

References Cited by the Examiner

UNITED STATES PATENTS

| | | | |
|---|---|---|---|
| 1,824,777 | 9/31 | Harrison | 310—9.5 |
| 2,540,187 | 2/51 | Cherry | 310—9.8 |
| 2,886,787 | 5/59 | Broadhead et al. | 310—9.8 |

OTHER REFERENCES

Cady: "Piezoelectricity," published by McGraw-Hill Book Company, New York, 1946, pages 455–460.

MILTON O. HIRSHFIELD, *Primary Examiner.*

HERMAN K. SAALBACH, STEPHEN W. CAPELLI, *Examiners.*